United States Patent [19]

Takezono et al.

[11] 4,064,483
[45] Dec. 20, 1977

[54] ERROR CORRECTING CIRCUIT ARRANGEMENT USING CUBE CIRCUITS

[75] Inventors: Takashi Takezono; Hisashige Ando, both of Kawasaki, Japan

[73] Assignee: Fujitsu Limited, Kawasaki, Japan

[21] Appl. No.: 750,152

[22] Filed: Dec. 13, 1976

[30] Foreign Application Priority Data

Dec. 18, 1975   Japan .................................. 50-150811

[51] Int. Cl.$^2$ ............................................. G06F 11/12
[52] U.S. Cl. ........................................ 340/146.1 AL
[58] Field of Search ............................ 340/146.1 AL

[56] References Cited

U.S. PATENT DOCUMENTS

| | | | |
|---|---|---|---|
| 3,278,729 | 10/1966 | Chien .......................... | 340/146.1 AL |
| 3,685,014 | 8/1972 | Hsiao et al. .................. | 340/146.1 AL |
| 3,714,629 | 1/1973 | Hong et al. .................. | 340/146.1 AL |
| 4,030,067 | 6/1977 | Howell et al. ............... | 340/146.1 AL |

*Primary Examiner*—Jerry Smith

*Attorney, Agent, or Firm*—Staas & Halsey

[57] ABSTRACT

An error correcting circuit utilizing a cube circuit for correcting errors in data having $n+1$ bits in accordance with the syndromes $S_1$ and $S_3$ from a check matrix H. The circuit comprises a generator for generating syndromes $S_1$ and $S_3$, means for providing $(S_1 - a_i)$ based on the modulo 2 calculation for the $i_{th}$ line vector $$\begin{bmatrix} a_i \\ a_i^3 \end{bmatrix}$$

of the check matrix H corresponding to each data bit $d_1$, means for multiplying $(S_1 - a_i)$ three times, check means for checking the coincidence between $(S_1 - a_i)$ and $(S_3 - a_i^3)$, and an inverting means for inverting the $d_i$ bit when the coincidence is detected.

In the present invention, by utilizing a cube circuit the check circuit can be simplified.

9 Claims, 6 Drawing Figures

ERROR CORRECTING CIRCUIT ARRANGEMENT USING CUBE CIRCUITS

BACKGROUND OF THE INVENTION

The present invention relates to a 2-bit error correcting circuit arrangement using cube circuits, more particularly, a BCH code check matrix H in which $(n+1)$ cube circuits as check circuits, each corresponding to each of the data bits $d_o$ to $d_n$, are so arranged in parallel that the error correction may be carried out quickly, and the same circuit arrangement may be adopted for said check circuits.

In order to improve the reliability of a data processing system, error correcting codes are widely used. Among others, a BCH code with a 2-bit error correcting function has been adopted in error correcting systems. Various systems, such as the one proposed by R. T. Chien, are well known for decoding said BCH code. Such systems will be generally referred to hereinbelow as conventional systems.

However, said conventional systems use in general shift registers and cannot correct errors before such registers have been shifted by plural clocks (which will be described later with reference to FIG. 1). Accordingly, when attempts have been made to develop the conventional system, for example, the one by R. T. Chien, so that high speed processing may be done in parallel for error corrections, the system will necessarily become a complicated one as can be seen with reference to FIG. 2. In this case, the individual circuits $x\alpha^{44}$, $x\alpha^{43}$ ... $x\alpha^3$ illustrated in FIG. 2 will take different forms, resulting in a high cost and a complicated structure of the circuit arrangement. This becomes a further obstacle for large-scale integration of such a circuit.

SUMMARY OF THE INVENTION

The main object of the present invention is, therefore, to eliminate the above-mentioned drawbacks of the conventional error correcting circuit arrangement, by providing an improved error correcting circuit arrangement which permits a rapid error correction by means of a parallel processing operation and which has a standardized circuit configuration for the checking operation and for said parallel processing. The present invention is characterized in that there is provided an error correcting circuit arrangement using cube circuits, in which a 2-bit error correcting BCH code check matrix H is calculated with respect to data D $(d_o, d_1, d_2, \ldots d_n)$, to correct error bits, if any, in said data on the basis of a syndrome $S_1$ derived from the upper half of said check matrix and of a syndrome $S_3$ derived from the lower half of said check matrix. Check circuits of $(n+1)$ in total number, each corresponding to each data bit, are disposed in parallel, each of said check circuits being adapted to check, according to line vector $(a_i, a_j^3)$, in said check matrix H, allocated to each said circuit, whether or not the following equation is established in modulo 2 operation $$(S_1 - a_i)^3 - (S_3 - a_i^3) = 0 \ldots (1)^*$$

when said equation is established, the errors existing in said data bits are corrected. The present invention will be better understood from the description presented below with reference to the accompanying drawings.

DETAILED DESCRIPTION OF THE PREFERRED EMBODIMENT

Figure 1:
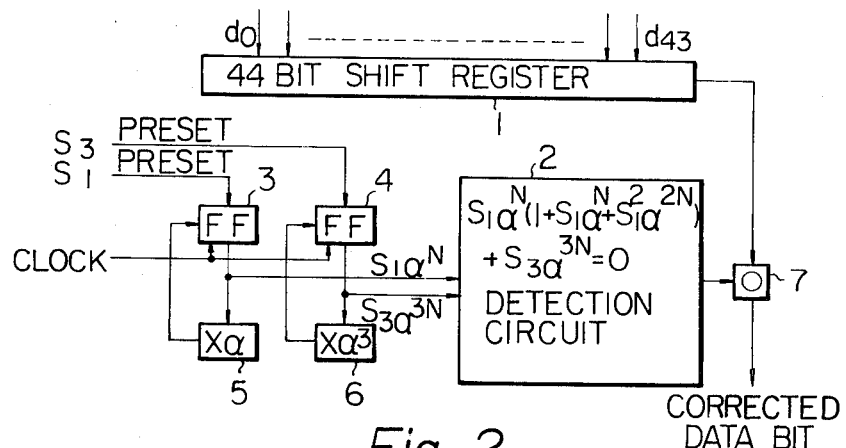
FIG. 1 shows an example of a conventional system.

Before entering into the description of the preferred embodiment according to the present invention, examples of the conventional systems will be described.

First, supposing that $\alpha$ denotes a root or roots of a polynomial $P(x) = 1 + x + x^6 = 0$, then $\alpha^0, \alpha^1, \alpha^2 \ldots \alpha^{62}$ become all the roots of the polynominal $P(x) = 0$. For instance, let us make sure or verify that $\alpha^2$ is a root of $P(x) = 0$. By substitution of $\alpha^2$, we obtain the equation $P(\alpha^2) = 1 + \alpha^2 + \alpha^{12}$, where $\alpha^{12} = (\alpha^6)^2$, and establishing $\alpha^6 = 1 + \alpha$(in the modulo 2 operation, the value having a symbol $(+)$ and $(-)$ is the same), $\alpha^{12}$ becomes $(1+\alpha)^2$ as the following equation establishes:

$$\alpha^{12} = (1+\alpha)^2 = 1 + \alpha + \alpha + \alpha^2 = 1 + \alpha - \alpha + \alpha^2 = 1 + \alpha^2$$

Therefore, $\alpha^2$ is one of the roots of the polynominal $P(x) = 0$. Similarly, $\alpha^3$ through $\alpha^{62}$ can be proved to be the other roots of the polynominal.

Assuming generally that a degree of the polynominal $P(x)$ is $k$, the number of elements which satisfies $P(x) = 0$ becomes $2^k - 1$ defining roots $\alpha^0$ through $\alpha^{2k-2}$. Accordingly, for instance, when the data length which is subjected to correct errors is 32 bits to 63 bits, $k$ becomes sixth degree and, when the data length is 64 to 127 bits, $k$ becomes the seventh degree. In general, when the length of data bits is $n+1$ and the degree of polynominal is $k$, the following condition must be satisfied:

$$2^{(k-1)} \leq n+1 \leq 2^k - 1$$

The arbitrary constants $a_0 \ldots a_n$ which will appear in this specification denote the elements selected from $\alpha^0 \ldots \alpha^{2k-2}$. In this way, the $k_{th}$ degree of the polynominal can be used in accordance with the data length. From this discussion, it should be understood that an arbitrary number of $k°$ can be utilized among 63 elements.

Now, referring back to the system according to the conventional technique, a BCH check matrix H is formed in accordance with the given data D $(d_0, d_1, d_2, \ldots d_n)$ as follows:

$$H = \begin{bmatrix} \alpha^0 \alpha^1 \alpha^2 \ldots \alpha^{61} \alpha^{62} \\ \alpha^0 \alpha^3 \alpha^6 \quad \alpha^{57} \alpha^{60} \end{bmatrix} \quad (1)$$
(where $\alpha^{63} = \alpha^0$)

From the right side of this matrix, the check matrix H' can be calculated by utilizing line vectors of $n+1$. That is:

$$H' = \begin{bmatrix} \alpha^{19} \alpha^{20} \alpha^{21} \ldots \alpha^{62} \\ \alpha^{57} \alpha^{60} \alpha^0 \ldots \alpha^{60} \end{bmatrix} \quad (2)$$

Assuming now that errors occur in bits $d_i$ and $d_j$, a syndrome $S_1$ produced from the upper half of said check matrix and a syndrome $S_3$ from the lower half will be expressed by the formulae:

$$\begin{aligned} \alpha^i + \alpha^j &= S_1 \\ \alpha^{3i} + \alpha^{3j} &= S_3 \end{aligned} \quad (3)$$

The above formula (3) will give the following:

$$\begin{aligned} \alpha^i + \alpha^j &= S_1 \\ \alpha^i \cdot \alpha^j &= S_1^2 + \frac{S_3}{S_1} \end{aligned} \quad (4)$$

As a result, said $\alpha^i$ and $\alpha^j$ are the roots of the following:

$$x^2 + S_1 x + (S_1^2 + S_3/S_1) = 0 \quad (5)$$

Accordingly, $\alpha^{19}, \alpha^{20}, \ldots \alpha^{62}$ are substituted for the $x$'s in the formula (5) to determine the values $i$ and $j$ which satisfy the formula (5), in order to correct the data bits $d_i$ and $d_j$.

However, it is not very easy to construct hardware which can check to see that the formula (5) is satisfied. For this reason, however, there is provided in the conventional system a circuit which checks whether or not the formula:

$$F(x) = S_1 \alpha^N (1 + S_1 \alpha^N + S_1^2 \alpha^{2N}) + S_3 \alpha^{3N} = 0 \quad (6)$$

is satisfied, by modifying the formula (5) on the assumption that $\alpha^{i+N} = \alpha^{63} = \alpha^0 = 1$ is established.

In FIG. 1 there is shown an example of a conventional circuit arrangement which corrects data bits $d_i$ and $d_j$ by determining $N = i, j$ which satisfies the above formula (6). In FIG. 1, the reference numeral 1 indicates a shift register in which data $d_0$ through $d_{43}$ are read from, for example, a memory, are set, and then are shifted by each clock to deliver bits one by one; 2 indicates a circuit to detect $F(x) = 0$; 3 and 4 indicate flip flop circuits; 5 indicates an $x\alpha$ circuit; 6 indicates an $x\alpha^3$ circuit; and the numeral 7 indicates a bit correcting circuit.

Figure 2:
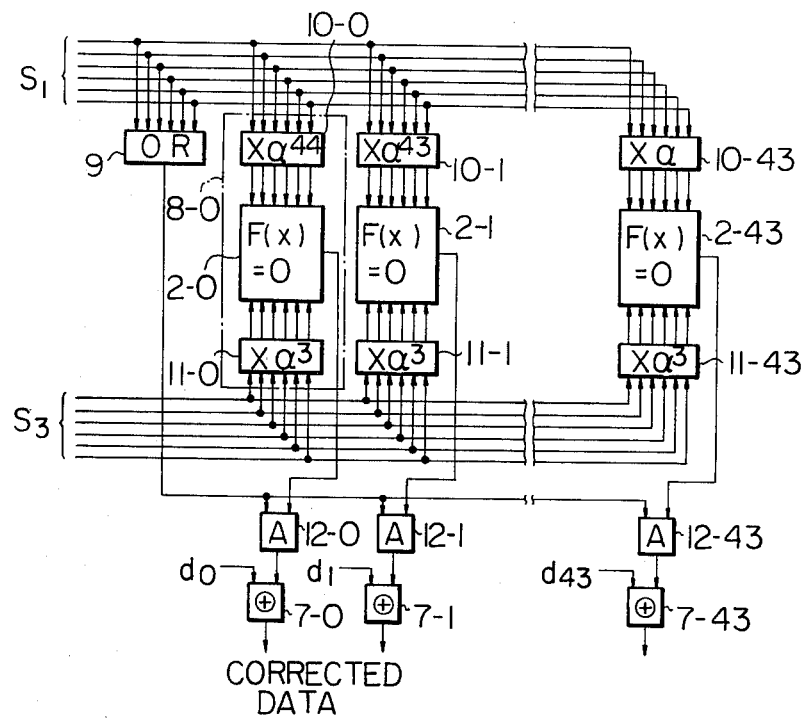
FIG. 2 shows an example of an arrangement obtainable by improving the system in FIG. 1.

In synchronism with the data bits $d_{43}$ through $d_0$ delivered from the shift register 1 for each clock, the $F(x) = 0$ detector circuit 2 checks whether or not $F(x) = 0$ is satisfied. If $F(x) = 0$ is satisfied, a logic "1" is applied from the detector circuit 2 to the bit correcting circuit 7 to invert data bits delivered also in the above-mentioned synchronism. Namely, the errors are thus corrected. With the aforementioned conventional system using shift registers, errors cannot be corrected before they have been shifted by 44 clocks. As a result, such a system is inconvenient in that the processing speed is low. FIG. 2 shows an improvement of the arrangement in FIG. 1, namely, another conventional arrangement in which 44 check circuits are disposed in parallel correspondingly to data bits $d_0$ to $d_{43}$. In FIG. 2, the reference numeral 8-0 indicates a check circuit; 2-0 to 2-43 indicate circuits corresponding to the $F(x) = 0$ detector circuit 2 in FIG. 1, respectively; 7-0 to 7-43 indicate circuits corresponding to bit correcting circuit 7 in FIG. 1; 9 indicates an error occurrence detector circuit; 10-0 to 10-43 and 11-0 to 11-43 indicate multiplication circuits, respectively; and 12-0 to 12-43 indicate AND circuits, respectively.

The multiplication circuit 10-i will generate $\alpha^N$, which appears in the previously-mentioned formula (6), while the circuit 11-i will generate $\alpha^{3N}$. When syndromes $S_1$ and $S_3$ are given, each $F(x) = 0$ detector circuit checks whether or not the $F(x) = 0$ is satisfied. If it is satisfied, a logic "1" is delivered at the output of the detector circuit. When the error-occurrence detector circuit 9 detects the existence of an error, the AND circuit 12-i is energized to invert data bits $d_i$ and/or $d_j$ corresponding to the data bits $d_0$ through $d_{43}$ supplied in parallel. It should be noted that when no error exists, all the syndromes $S_1$ become zero.

As will be clear from the foregoing, the circuit arrangement as shown in FIG. 2 uses no shift registers, which are used in the example in FIG. 1, and permits a high-speed error correction by processing in parallel the data bits $d_0$ through $d_{43}$. With the second conventional system in FIG. 2, the $F(x) = 0$ detector circuits 2-0 to 2-43 among the check circuits 8 can be circuits each of which having the same construction, but the multiplication circuits 10 and 11 need 44 different circuit configurations. For this reason, the circuit arrangement in FIG. 2 will be high in production cost and complex in structure. Attempts have been made at integration (for example, integration of the circuits 8, 12 and 7 in FIG. 2 into one IC circuit) in order to raise the packaging density and to reduce the manufacturing cost. Because of the above-mentioned difference in circuit configurations, however, such integration is impossible.

The present invention will now be described. The present invention is based on the following concept. When the BCH code check matrix H:

$$H = \begin{bmatrix} \alpha^0 \alpha^1 \alpha^2 \ldots \alpha^{43} \\ \alpha^0 \alpha^3 \alpha^6 \ldots \alpha^3 \end{bmatrix} \quad (7)$$

(where $\alpha^{3(44)} = \alpha^3$)

is calculated with respect to data D ($d_0, d_1, \ldots d_{43}$), and if errors occur in the data bits for example, $d_i$ and $d_j$, syndrome, $S_1$ produced from the upper half of the formula (7) and syndrome $S_3$ from the lower half will be expressed as follows.

$$\begin{aligned} S_1 &= \alpha^i + \alpha^j \\ S_3 &= \alpha^{3i} + \alpha^{3j} \end{aligned} \quad (8)$$

If the formula (1)° is modified, $$\begin{aligned} S_1 - \alpha^i &= \alpha^j, \quad S_3 - \alpha^{3i} = \alpha^{3j} \\ S_1 - \alpha^j &= \alpha^i, \quad S_3 - \alpha^{3j} = \alpha^{3i} \end{aligned} \quad (9)$$

Accordingly, the following equations are established.

$$\begin{aligned} (S_1 - \alpha^i)^3 - (S_3 - \alpha^{3i}) &= 0 \\ (S_1 - \alpha^j)^3 - (S_3 - \alpha^{3j}) &= 0 \end{aligned} \quad (10)$$

Therefore, it becomes:

$$(S_1 - x)^3 - (S_3 - x^3) = 0 \quad (11)$$

According to the present invention, check circuits to provide for the above-mentioned processing operation are constructed. It is possible to determine data bits $d_i$ and $d_j$ where errors exist by substituting $\alpha^0, \alpha^1, \alpha^2, \ldots \alpha^{43}$ one by one for the value of $x$. It should be noted that subtraction in binary numbers is equivalent to addition, both of them being able to be realized in an EXCLUSIVE OR circuit.

The hardware according to the present invention can also be realized by using shift registers as in FIG. 1. In order to obtain higher-speed data processing, however, a parallel processing circuit as illustrated in FIG. 2 is advantageously adopted.

Figure 3:
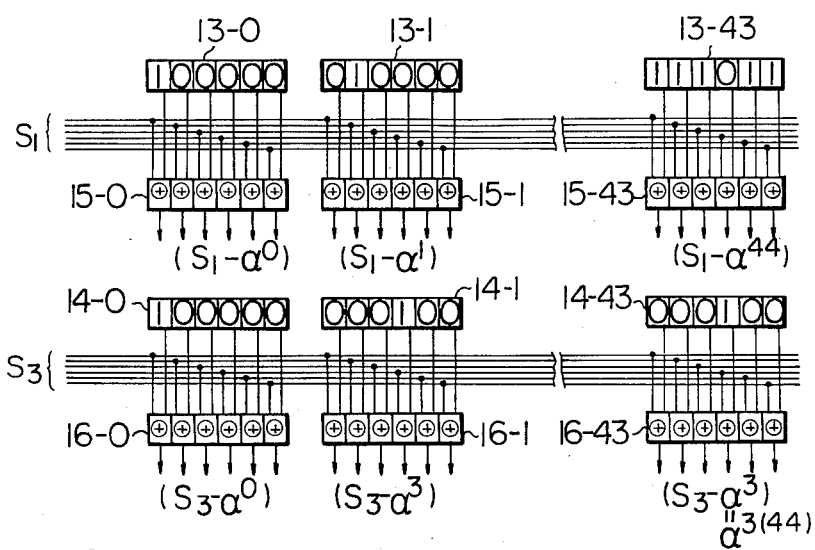
FIGS. 3 to 5 show partial arrangements used in the present invention.

FIG. 3 shows a circuit arrangement by which $(S_1 - x)$ and $(S_3 - x^3)$ in the formula (11) are provided. In FIG. 3, the reference numerals 13-0 to 13-43 indicate registers to give $\alpha^0$ through $\alpha^{43}$ in the upper half of the formula (7); 14-0 through 14-43 indicate registers to give $\alpha^0$ to $\alpha^3$ in the lower half of the formula (7); and 15-0 through 15-43 and 16-0 through 16-43 indicate subtraction circuits, respectively. It should be noted that addition and subtraction of binary "1" bits can be performd with EXCLUSIVE OR circuits.

Figure 4:
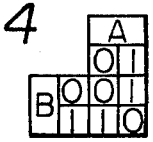
Figure 5:
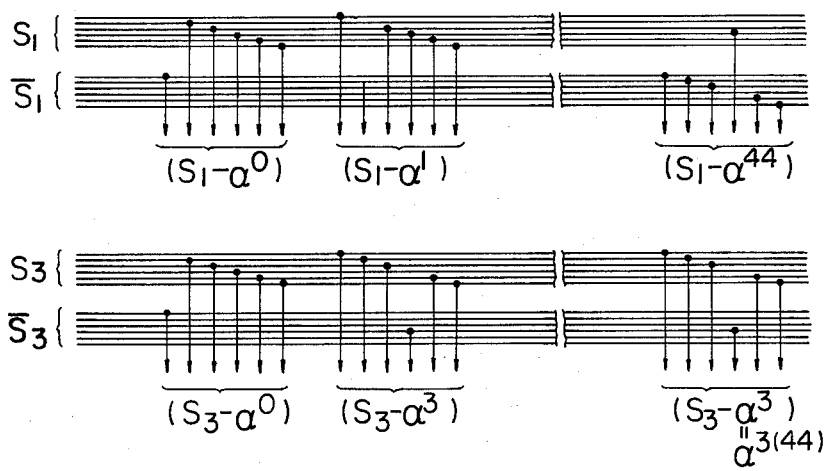

The circuit arrangement illustrated in FIG. 3 will give $(S_1 - x)$ and $(S_3 - x^3)$. Data to be stored in the registers 13-0 through 13-43 and 14-0 through 14-43 will be determined depending on said check matrix H. Consequently, read only memories (ROM) may be adopted, but there remains something to be improved. As seen in FIG. 4, the arithmetic function A ⊕ B will result in A ⊕ B = A if B = 0, for example. And, if B = 1, the arthmetic function A ⊕ B will result in A ⊕ B = $\overline{A}$. Thus, if $\overline{S}_1$ and $\overline{S}_3$ are conditioned for the syndromes $S_1$ and $S_3$, respectively, as shown in FIG. 5, when obtaining, for instance, it should be understood that a condition will be satisfied by alloting the first bit of $\overline{S}_1$ as the first bit of $(S - \alpha^0)$ and the second to sixth bits of $S_1$ as the second to sixth bits of $(S - \alpha^0)$ because $\alpha^0 = 100,000$. According to the present invention, the circuit arrangement is considerably simplified by adopting the circuit configuration as shown in FIG. 5.

Figure 6:
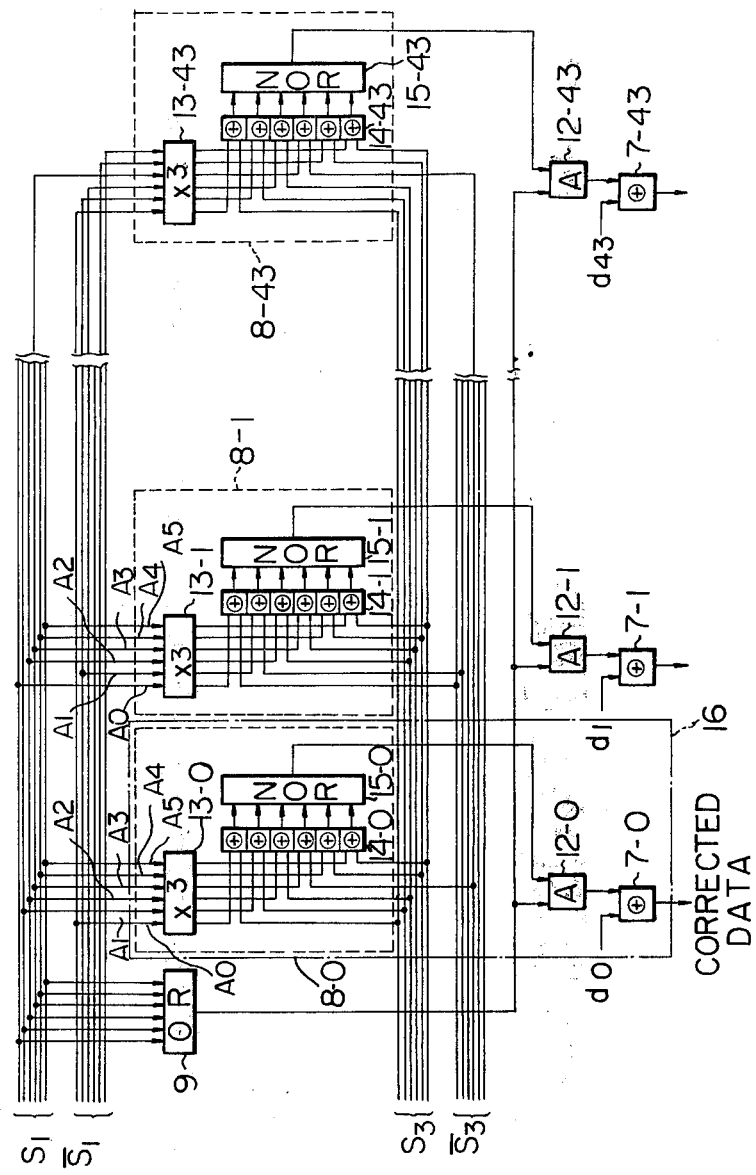
FIG. 6 shows an embodiment constructed according to the present invention.

FIG. 6 shows one embodiment according to the present invention. In FIG. 6, the reference numerals 7-10 through 7-43, 8-0 through 8-43, 9, and 12-0 through 12-43 indicate the corresponding components in FIG. 2; 13-0 through 13-43 indicate cube circuits; 14-0 indicates a subtraction circuit; and 15-0 through 15-43 indicate all-zero detector circuits. According to the present invention, check circuits 8-0 through 8-43 are disposed in parallel correspondingly to the data bits $d_0$ to $d_{43}$, similar to the arrangment as shown in FIG. 2. Also similar to the arrangement in FIG. 2, the occurrence of an error is detected by the parity check circuit 9, and the error correction is carried out with respect to the data bit $d_p$ corresponding to the check circuit 8-p which has issued a logic "1" signal.

This may also be considered as defining that the check circuits 8-0 to 8-43 are supplied at their inputs with $(S_1 - \alpha^0)$ and $(S_3 - \alpha^0)$, $(S_1 + \alpha^1)$ and $(S_3 - \alpha^3)$, ... $(S_1 - \alpha^{44})$ and $(S_3 - \alpha^3)$. That is to say, in the check circuit 8-0, for example, it is arranged to check whether or not the formula:

$$(S_1 - \alpha^0)^3 - (S_3 - \alpha^0) = 0 \qquad (12)$$

is satisfied when $\alpha^0$ is substituted for $x$. When all the bits are logic "0", namely, the formula (12) is satisfied, cubing the input signal $(S_1 - \alpha^0)$ (to be considered to be bit strings $A_0$ to $A_5$) and carrying out the subtraction between said cubed input signal and input signal $(S_3 - \alpha^0)$ for each bit causes the all-zero detector circuit 15-0 to deliver at its output a logic "1" signal. This is true for the check circuits 8-1 to 8-43.

The arrangement of cube circuits 13-0 to 13-43 will now be described.

Assuming that the input signal is generally $A_0 + A_1X + A_2X^2 + \ldots A_5X^5$ and said signal is delivered as $B_0 + B_1X + B_2X^2 + \ldots B_5X^5$ at the outputs of the cube circuits, there should be established the following relation.

$$(A_0 + A_1X + A_2X^2 + A_3X^3 + A_4X^4 + A_5X^5)^3 = B_0 + B_1X + B_2X^2 + B_3X^3 + B_4X^4 + B_5X^5 \qquad (13)$$

When the relation between the factors on the left and right sides are determined by modifying the formula (13) with mod. $1 + x + x^6$ (said $\alpha$ is the root of $1 + x + x^6$), the formula:

$$B_0 = \overline{A}_3(A_0 + A_4) + A_1(A_4 + A_5) + A_5(A_2 + A_3) + A_2 \qquad (14)$$

$$B_1 = A_1(A_0 + A_3 + A_4) + A_3(A_0 + A_2 + A_4) + A_4A_5 + A_2$$

$$B_2 = (A_0 + A_5)(A_1 + A_2 + A_4) + A_1A_3 + A_4\overline{A}_2$$

$$B_3 = (A_0 + A_2 + A_5)(A_3 + A_4) + A_1\overline{A}_4 + A_5\overline{A}_2 + A_3$$

$$B_4 = (A_0 + A_2)(A_4 + A_5) + A_2(A_0 + A_1) + A_4(A_1 + A_3 + A_5) + A_3$$

$$B_5 = A_2(A_1 + A_4) + A_1(A_3 + A_5) + A_5\overline{A}_3$$

should be established.

The above-mentioned formula (14) may be expressed in various forms depending on the modification method, so the relation is not always limited to the form of the formula (14).

Figure 7:
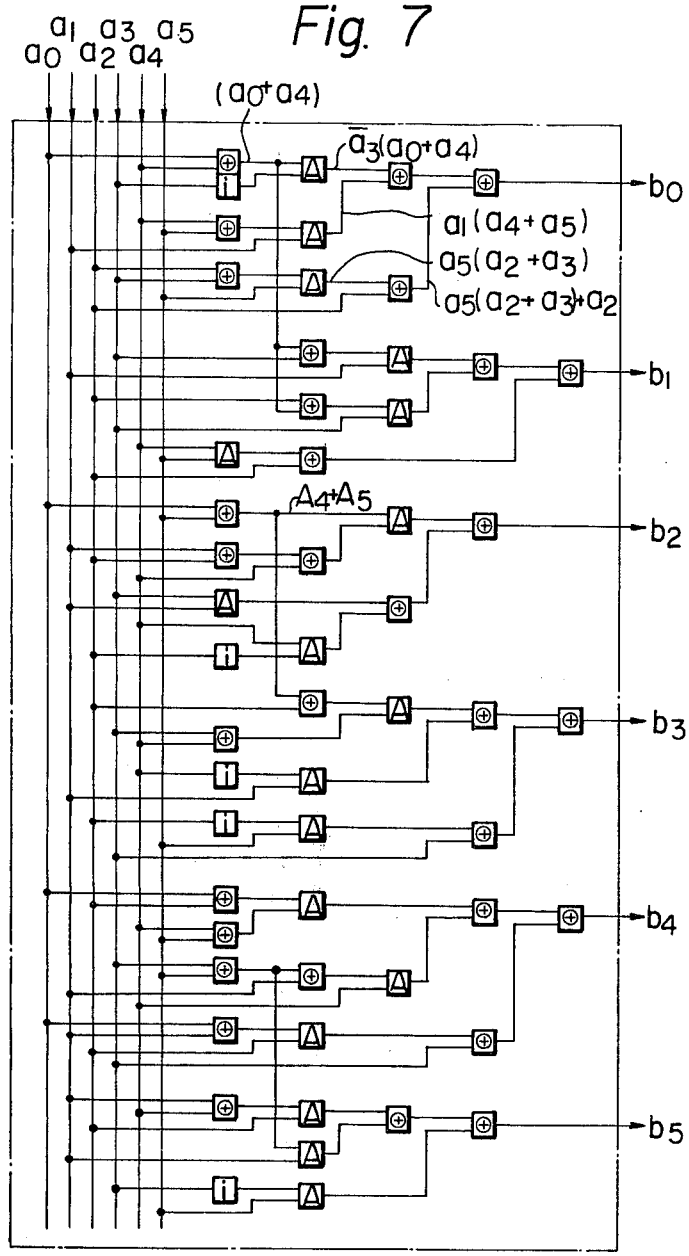
FIG. 7 shows an embodiment of a cube circuit used in the present invention.

In any event, by arranging a circuit which can perform the processing operation according to the formula (14), an output derived by cubing a given input can be provided. FIG. 7 illustrates an embodiment of a cube circuit which performs the processing according to the formula (14). In this Figure, the symbol ⊕ means addition by the EXCLUSIVE OR circuit, $i$ indicates an inverter circuit and A indicates an AND circuit. As is apparent from FIG. 7, bit $B_0$, for example, satisfies the top relation in the formula (14).

In the foregoing, the arrangement in which logic circuits are used to form cube circuits has been described. However, the cube circuits may be made of a ROM (read-only memory) which stores a conversion table. In this case, it is sufficient to take 6 bits of $(S_1 - \alpha^0) = (A_0A_1A_2A_3A_4A_5)$ as address data and to prepare ROMs which will deliver at their outputs 6 bits of $(S_1 - \alpha^0)^3 = (B_0B_1B_2B_3B_4B_5)$. The memory capacity will be $2^6$W × 6 bits.

Referring back to FIG. 6, if signals supplied to the cube circuits 13-0 through 13-43 are taken as input signals $A_0$ to $A_5$ shown in FIG. 7, it will be apparent to those skilled in the art that all the cube circuits 13-0 to 13-43 can be arranged identically. Thus, it is evident that all the check circuits 8-0 to 8-43 can be formed identically, except that input signals to the respective check circuits are to be modified into $(S_1 - \alpha^0)$ and $(S_3 - \alpha^0)$, $(S_1 - \alpha^1)$ and $(S_3 - \alpha^3)$, ... Namely, when adopting the circuit arrangement shown in FIG. 6, it is only necessary to integrate check circuits 16 (including elements 8, 12, and 7) which are of identical configuration. This is very advantageous from the standpoint of higher packaging density and lower manufacturing cost.

As will be understood from the forgoing, the present invention permits the advantageous realization of a higher-speed error correcting circuit arrangement and the standardization of check circuits.

What is claimed is:

1. Error correcting circuit utilizing a cube circuit for correcting errors in the data $(d_0 d_1 d_2 \ldots d_n)$ having $n+1$ bits in accordance with the syndromes $S_1$ and $S_3$, where $S_1 = [a_0 a_1 a_2 \ldots a_n] \begin{bmatrix} d_0 \\ d_1 \\ d_2 \\ \vdots \\ d_n \end{bmatrix}$ $S_3 = [a_0{}^3 a_1{}^3 a_2{}^3 \ldots a_n{}^3] \begin{bmatrix} d_0 \\ d_1 \\ \vdots \\ d_n \end{bmatrix}$ which are obtainable from the calculation of a check matrix H for the BCH code $$H = \begin{bmatrix} a_0 a_1 a_2 \ldots \ldots a_n \\ a_0{}^3 a_1{}^3 a_2{}^3 \ldots \ldots a_n{}^3 \end{bmatrix}$$

said error correcting circuit comprising:
generator means for generating said syndromes $S_1$ and $S_3$ based on the check matrix H;
means for providing a term $(S_1 - a_i)$ based on the modulo 2 calculation to the $i_{th}$ line vector $$\begin{bmatrix} a_i \\ a_i{}^3 \end{bmatrix}$$

of said check matrix H corresponding to each data bit $d_i$;
means for multiplying said $(S_1 - a_i)$ term by three times so as to cube said term;
means for providing a term $(S_3 - a_i{}^3)$ based on the modulo 2 calculation to the $i_{th}$ line vector $$\begin{bmatrix} a_i \\ a_i{}^3 \end{bmatrix}$$

of said check matrix H corresponding to each data bit $d_i$;
check means for checking the accordance between the terms $(S_1 - a_i)^3$ and $(S_3 - a_i{}^3)$; and
inverting means for inverting said $d_i$ bit when the accordance is detected.

2. Error correcting circuit as set forth in claim 1, wherein said respective means for providing said $(S_1 - a_i)$ and $(S_3 - a_i{}^3)$ terms comprise a plurality of signal lines for producing syndromes $S_1$ and $\overline{S}_1$, and a plurality of signal lines for producing syndromes $S_3$ and $\overline{S}_3$, respectively, and a plurality of output lines selectively connected to the $S_1$ and $\overline{S}_1$ signal lines in accordance with each value $a_i$ among said $S_1$ and $\overline{S}_1$ signal lines, and a plurality of output lines selectively connected to the $S_3$ and $\overline{S}_3$ signal lines in accordance with each value $a_i$ among said $S_3$ and $\overline{S}_3$ signal lines, respectively.

3. Error correcting circuit as set forth in claim 1, wherein said error correcting circuit comprises a parallel arrangement of individual multiplying means, providing means, check means and inverting means, one of each for each data bit $d_i$.

4. Error correcting circuit utilizing a cube circuit for correcting errors in the data $(d_0 d_1 d_2 \ldots d_n)$ having $n+1$ bits in accordance with the syndrome $S_1$ and $S_3$, where where $S_1 = [a_0 a_1 a_2 \ldots a_n] \begin{bmatrix} d_0 \\ d_1 \\ d_2 \\ \vdots \\ d_n \end{bmatrix}$ $S_3 = [a_0{}^3 a_1{}^3 a_2{}^3 \ldots a_n{}^3] \begin{bmatrix} d_0 \\ d_1 \\ \vdots \\ d_n \end{bmatrix}$ which are obtainable from calculation of the check matrix H for a BCH code, said error correcting circuit comprising:
a read only memory for storing a conversion table for converting $(S_1 - a_i) = (A_0 A_1 A_2 A_3 A_4 A_5)$ to $(S_1 - a_i)^3 = (B_0 B_1 B_2 B_3 B_4 B_5)$,
means responsive to a given value of $(S_1 - a_i)$ for addressing said read only memory to cause readout of a corresponding value of $(S_1 - a_i)^3$,
check means for checking the coincidence between the values of $(S_1 - a_i)^3$ and $(S_3 - a_i{}^3)$, and
inverting means for inverting said $d_i$ bit when the coincidence is detected.

5. Error correcting circuit for correcting errors in the data $(d_0 d_1 d_2 \ldots d_n)$ having $n+1$ bits in accordance with the syndromes $S_1$ and $S_3$, where $S_1 = [a_0 a_1 a_2 \ldots a_n] \begin{bmatrix} d_0 \\ d_1 \\ d_2 \\ \vdots \\ d_n \end{bmatrix}$ $S_3 = [a_0{}^3 a_1{}^3 a_2{}^3 \ldots a_n{}^3] \begin{bmatrix} d_0 \\ d_1 \\ \vdots \\ d_n \end{bmatrix}$ which are obtainable from the calculation of a check matrix H for the BCH code $$H = \begin{bmatrix} a_0 a_1 a_2 \ldots \ldots a_n \\ a_0{}^3 a_1{}^3 a_2{}^3 \ldots \ldots a_n{}^3 \end{bmatrix}$$

said error correcting circuit comprising:
means for generating said syndromes $S_1$ and $S_3$ from the check matrix H;
means for providing a term $(S_1 - a_i)$ based on the modulo 2 calculation to the $i_{th}$ line vector $$\begin{bmatrix} a_i \\ a_i{}^3 \end{bmatrix}$$

of said check matrix H corresponding to each data bit $d_i$;
means for cubing said $(S_1 - a_i)$ term to provide $(S_1 - a_i)^3$;
means for providing a term $(S_3 - a_i{}^3)$ based on the modulo 2 calculation to the $i_{th}$ line vector $$\begin{bmatrix} a_i \\ a_i^3 \end{bmatrix}$$

of said check matrix H corresponding to each data bit $d_i$;

means for detecting coincidence between $(S_1 - a_i)^3$ and $(S_3 - a_i^3)$; and means responsive to said coincidence detected by said detecting means for correcting said data bit $d_i$.

6. Error correcting circuit as set forth in claim 5, wherein said cubing means is a multiplier circuit for multiplying said $(S_1 - a_i)$ term by itself twice.

7. Error correcting circuit as set forth in claim 5, wherein said cubing means comprises a read only memory for holding a table for converting any term $(S_1 - x)$ to $(S_1 - x)^3$, and means responsive to a given value of said $(S_1 - a_i)$ term for addressing said memory so as to read out a value of $(S_1 - a_i)^3$.

8. Error correcting circuit as set forth in claim 5, wherein there are a plurality of $(S_1 - a_i)$ term providing means, cubing means, $(S_3 - a_i^3)$ term providing means, detecting means and correcting means, one for each data bit $d_i$, arranged in parallel.

9. Error correcting circuit as set forth in claim 8, wherein said individual $(S_1 - a_i)$ term providing means, cubing means, $(S_3 - a_i^3)$ term providing means, detecting means and correcting means are implemented by individual integrated circuits of identical circuit design.

* * * * *

UNITED STATES PATENT AND TRADEMARK OFFICE
CERTIFICATE OF CORRECTION

PATENT NO. : 4,064,483
DATED : December 20, 1977
INVENTOR(S) : TAKEZONO et al

It is certified that error appears in the above-identified patent and that said Letters Patent are hereby corrected as shown below:

In the Abstract, lines 7 and 8, the bracketed expression should be $$--\begin{bmatrix} a_i \\ a_i^3 \end{bmatrix}--$$

In the Abstract, line 11, "$(S_1-a_i)$" should be $--(S_1-a_i)^3--$.
Column 2, line 38, before "sixth" insert --the--.
Column 4, equation 7, ")" should be --]--.
Column 5, line 35, "7-10" should be --7-0--.
Column 7, line 48, after "$(S_1-a_i)^3$" delete -- ―― --.

Signed and Sealed this

Sixteenth Day of May 1978

[SEAL]

Attest:

RUTH C. MASON
Attesting Officer

LUTRELLE F. PARKER
Acting Commissioner of Patents and Trademarks